United States Patent [19]

Gryk

[11] Patent Number: 4,812,778
[45] Date of Patent: Mar. 14, 1989

[54] ISOLATION AMPLIFIER

[75] Inventor: Leon Gryk, New Britain, Conn.

[73] Assignee: Electro-Mechanics, Inc., New Britain, Conn.

[21] Appl. No.: 148,016

[22] Filed: Jan. 25, 1988

[51] Int. Cl.[4] .............................................. H03F 3/68
[52] U.S. Cl. ........................................ 330/51; 330/84;
330/295; 330/306; 318/678; 318/681
[58] Field of Search ................. 330/51, 69, 84, 124 R,
330/146, 86, 260, 261, 295–297, 282, 306;
318/677, 678, 679, 681

[56] References Cited

U.S. PATENT DOCUMENTS 3,939,435  2/1976  Suzuki .............................. 330/295 X Primary Examiner—James B. Mullins
Attorney, Agent, or Firm—Chilton, Alix & Van Kirk

[57] ABSTRACT

An isolator for connection between an informational signal source and a high voltage controlled load may be used with numerous combinations of different input signal type and magnitude and output signal requirements. The compensation for input and output signal variation is accomplished by changing a minimum number of easily accessible plug-in passive circuit components.

16 Claims, 2 Drawing Sheets

ISOLATION AMPLIFIER

BACKGROUND OF THE INVENTION

1. Field of the Invention

The present invention relates to the provision of electrical isolation between two associated systems which operate at different power levels and particularly to the prevention of damage to a condition sensor should a fault occur at apparatus controlled in response to the condition sensed thereby. More specifically, the present invention is directed to an isolation amplifier which passes control signals, for example as provided by a sensor subassembly which operates at a low voltage, to the controlled apparatus, a high voltage operated pump or motor for example, while assuring against delivery of the high voltage to components of the sensor subassembly in the event of an electrical fault at the controlled apparatus. Accordingly, the general objects of the present invention are to provide novel and improved methods and apparatus of such character.

2. Description of the Prior Art

Isolation devices are used extensively in the process control and electric utility industries as buffers between hazardous and non-hazard locations and between safety and non-safety related areas. An example of a hazardous location would be one wherein a potentially explosive atmosphere occurs and condition responsive devices are employed to monitor that atmosphere. An example of safety versus non-safety areas would be a nuclear power plant wherein sensors positioned within the reactor core assembly provide information for use by external controllers and replacement of the sensor devices, should they be damaged by exposure to excess voltage or current fed back from a controller, would be exceedingly difficult at best.

An isolation device obviously must be characterized by a high degree of reliability. In the case of nuclear power plant usage, an isolation amplifier must meet the performance requirements set forth in IEEE Standard No. 279, Sections 3.7, 3.8 and 4.7.2. Isolation amplifiers have previously been available which satisfy the above-mentioned IEEE Standard criteria. However, as will be discussed below, these previously available isolation amplifiers have nevertheless had certain deficiencies.

In a typical operating environment, the function of an isolation amplifier is to prevent the high voltage used to energize a motor or other device from reaching the hazardous or safety related area should a fault condition occur through the device and its controls while supplying normal signals from a sensor subassembly located in the said area under non-fault conditions. Most previously available isolation amplifiers are permanently damaged by output fault voltages which are a fraction of that employed to energize the controlled device. Some previously available isolation amplifiers further permit a small amount of energy to be fed back from the controlled device to the amplifier input when a high voltage fault appears at the isolation amplifier output. Obviously, feed-through of energy from the output to the input of an isolator is undesirable. Also, the need to repair or replace an isolator after the occurrence of a fault should optimally be obviated. Thus, an ideal isolator will be characterized by no feed-through from the output to the input and by immediate recovery after the fault has been corrected.

Isolation amplifiers are used in a wide variety of applications. Thus, signal inputs to the isolation amplifier can be from many sources, can be either in analog or digital form and can be either voltage or current. Also, the power available for operating the isolation amplifier typically may be either from a 120 VAC source or a 12 VDC source. This wide variety of inputs, in combination with a potential choice of power sources, has resulted in many different isolation amplifiers being available to the protective system designer. System design and maintenance would be greatly facilitated if a single "off-the-shelf" isolation amplifier was available which, with minor modification commensurate with the intended use environment, could meet a wide variety of input and power source requirements.

SUMMARY OF THE INVENTION

The present invention overcomes the above-discussed and other deficiencies and disadvantages of the prior art by providing a novel and flexible manner in which electrical isolation between two interconnected systems may be accomplished. The present invention also encompasses a unique isolation amplifier which is characterized by no feed-through of energy from the output to input, no damage under output fault conditions, the ability to be easily adapted to be powered from AC line current or low voltage direct current and the ability to be configured to various input signal/output signal requirements simply by varying a few readily accessible passive circuit components.

An isolator in accordance with a preferred embodiment of the invention functionally comprises a pair of operational amplifiers. A first of these amplifiers functions as either a voltage follower or a non-inverting amplifier with a gain greater than unity. The other amplifier functions as a non-inverting voltage follower. A feedback circuit is connected between the output and inverting input of the first amplifier. The outputs of the amplifiers are interconnected and provide, across a pair of terminals, an output signal commensurate with the input signal received from the signal source. Through the use of "plug-in" passive circuit components, i.e., resistors, capacitors and short-circuiting jumpers, the first amplifier may be made responsive to an input signal in the form of a voltage or current, the gain of the amplifier may be varied thus changing its function and its output may be preset for a given input signal magnitude. Additionally, the isolator is selectively provided with AC and DC responsive power supplies. In one reduction to practice, eighteen different combinations of input signal/output signal/power supply are available through use of the "plug-in" components.

BRIEF DESCRIPTION OF THE DRAWINGS

The present invention may be better understood and its numerous objects and advantages will become apparent to those skilled in the art by reference to the accompanying drawing wherein.

DESCRIPTION OF THE DISCLOSED EMBODIMENT

Figure 1:
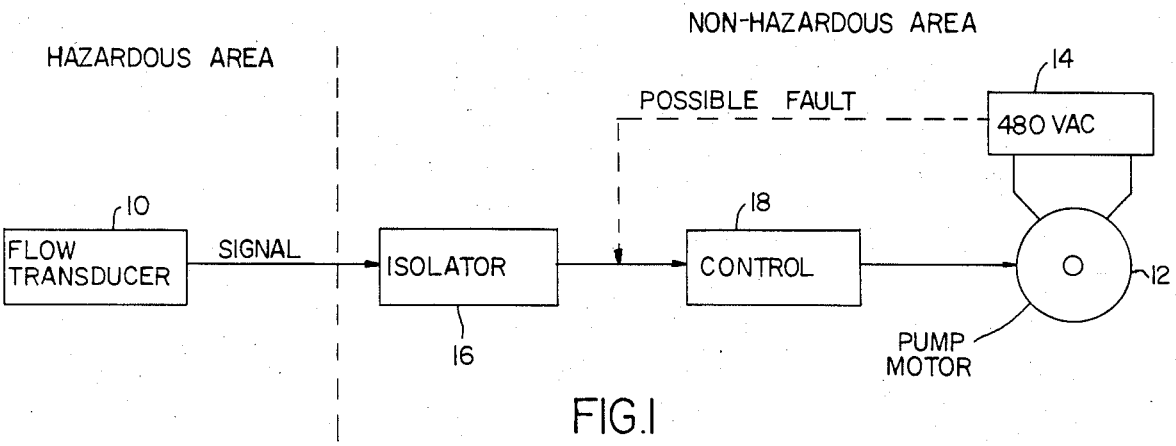
FIG. 1 is a system block diagram which represents a typical operating environment for the present invention.

As will be obvious from FIG. 1, which in part depicts a chemical processing plant, the function of an isolator in accordance with the present invention under normal operating conditions is to deliver signals, generated by a flow transducer 10, to a controller 12 for a pump motor 14. The pump motor will typically be energized from a 480 VAC source 16. The isolator 18 must also prevent feed-through of current or voltage, which may appear at the isolator output in the case of a fault occurring at the motor or its associated controller, to the isolator input and thence to the flow transducer. System requirements may dictate that the isolator be either line voltage, i.e., 120 VAC, or low voltage DC powered. The operating environment will also determine whether the flow transducer provides information bearing signals in analog or digital form. The operating environment further determines the type of input signal to the isolator, i.e., either current or voltage, the input signal range and the required output signal range. The isolation amplifier of the present invention may be operated with nine combinations of input and output signals in each of AC and DC powered versions. The input and output signal combinations are as follows:

TABLE I

| Model No. | Input | Output |
|---|---|---|
| A | 0–10 VDC | 0–10 VDC (unity gain) |
| B | 0–10 VDC | 0–10 VDC or less (gain less than unity) |
| C | 0–10 VDC | 0–10 VDC or less (gain greater than unity) |
| D | 4–20 mA | 1–5 VDC |
| E | 4–20 mA | 2–10 VDC |
| F | 4–20 mA | 0–8 VDC or less |
| G | 10–50 mA | 1–5 VDC |
| H | 10–50 mA | 2–10 VDC |
| I | 10–50 mA | 0–8 VDC or less |

Figure 2:
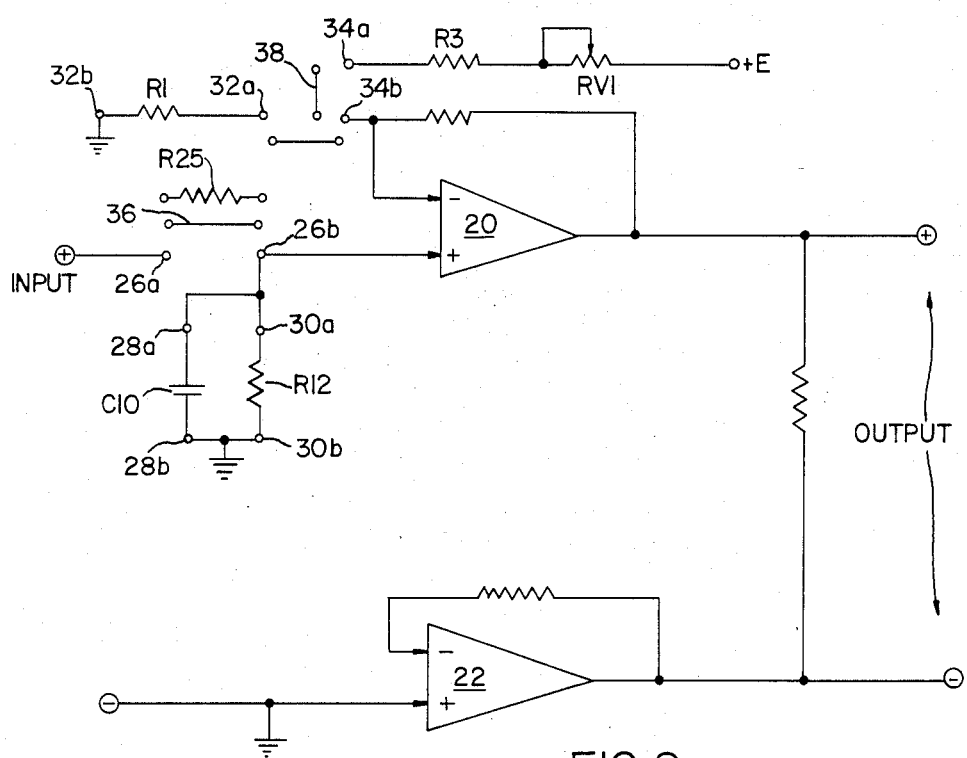
FIG. 2 is a simplified circuit block diagram which depicts an isolation amplifier in accordance with the present invention.

As represented in FIG. 2, an isolation amplifier in accordance with the present invention functionally comprises a pair of operational amplifiers 20 and 22. The input signal, for example the information bearing signal provided by the flow transducer 10 of FIG. 1, is applied between ground and the positive or non-inverting input of amplifier 20. The positive or non-inverting input of amplifier 20 is connected to ground via a resistance and the signal appearing at the isolator negative output terminal is fed back to the negative input of amplifier 22. Accordingly, amplifier 22 functions as a non-inverting voltage follower and amplifier 20 functions as a voltage follower or a non-inverting amplifier with a gain greater than one (1). The positive output of the isolator is fed back to the inverting input of amplifier 20 via a resistive circuit.

The circuit between the positive input terminal 24 to the isolator and the non-inverting input to amplifier 20 is interrupted by a pair of connectors 26a and 26b. Two pair of additional connectors 28a, 28b and 30a, 30b are connected between connector 26b and ground. Another pair of connectors 32a and 32b are connected between the inverting input of amplifier 20 and ground. Finally, a further pair of connectors 34a and 34b are connected between the inverting input terminal of amplifier 20 and a level shifting circuit comprising potentiometer RV1 and resistor R3.

Figure 3:
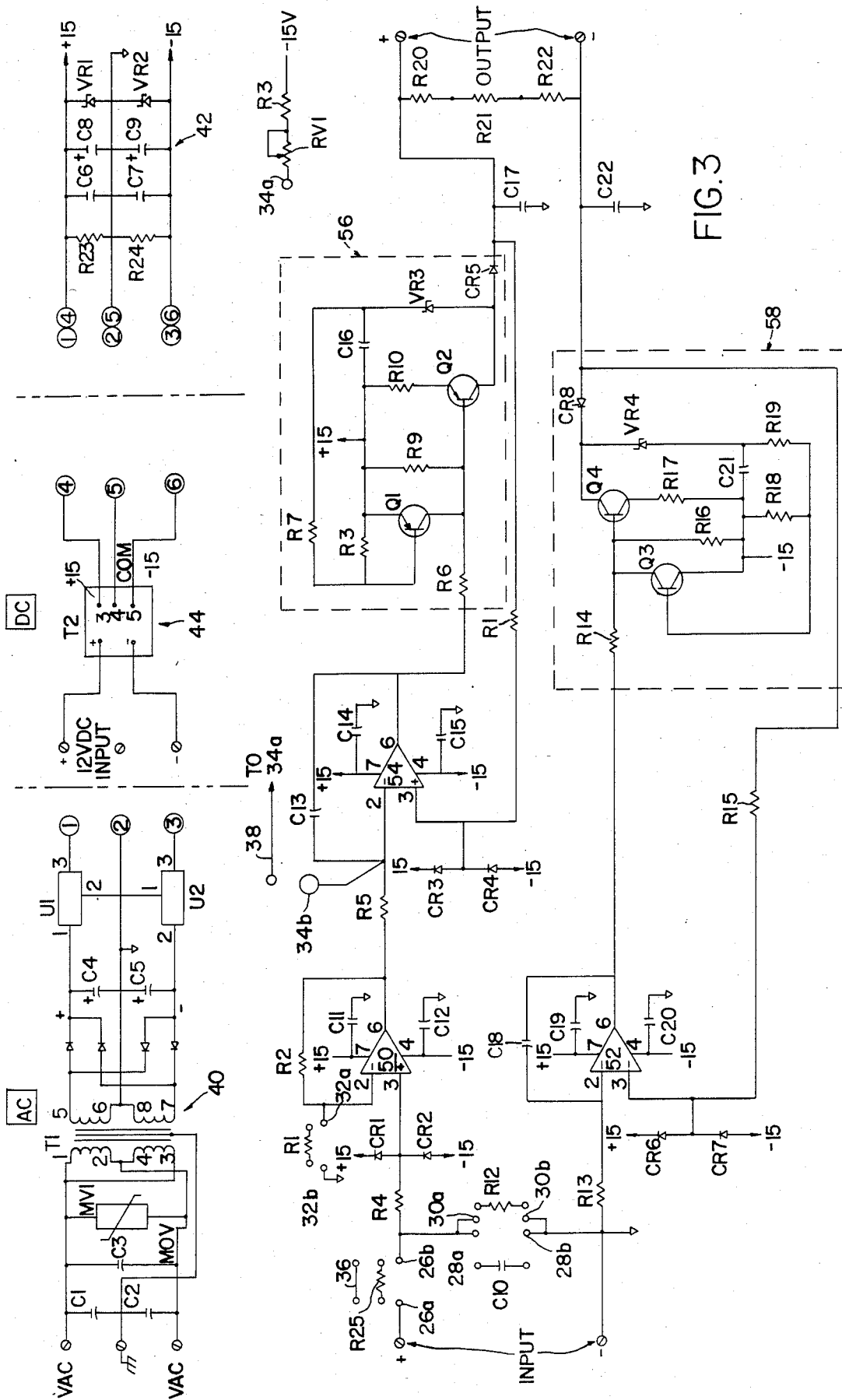
FIG. 3 is a schematic drawing of the isolation amplifier of FIG. 2.

Referring to FIG. 3, either a resistor R25 or a conductive jumper 36 will be installed between connectors 26a and 26b. Depending on the operating environment, a capacitor C10 will be installed between connectors 28a and 28b and/or a resistor will be installed between connectors 30a and 30b. Also depending on the intended use, a resistor R1 will or will not be installed between connectors 32a and 32b. Finally, again depending on the intended use, a jumper 38 will or will not be installed between connectors 34a and 34b.

Correlation between the use of the above-described passive circuit components, i.e., resistors R1, R12 and R25, capacitor C10 and jumpers 34 and 36, and the model numbers of Table I above is as follows:

TABLE II

| Model No. | R1 | R25/Jumper 34 | R12 | Jumper 36 |
|---|---|---|---|---|
| A | No | Jumper | No | No |
| B | No | R25 | Yes | No |
| C | Yes | Jumper | No | No |
| D | No | – | Yes | No |
| E | No | – | Yes | No |
| F | Yes | – | Yes | Yes |
| G | No | – | Yes | No |
| H | No | – | Yes | No |
| I | Yes | – | Yes | Yes |

Capacitor C10 will be employed when required to filter noise on the input signal.

The function of resistor R1 is to control the gain of operational amplifier 20, i.e., the gain of this amplifier is $1+R1/R2$. Thus, in effect, resistor R1 changes operational amplifier 20 to a non-inverting amplifier from a voltage follower when it is inserted between connectors 32a and 32b. The jumper 38, when in place between connectors 34a and 34b, adds a summing junction. That is, the insertion of jumper 36 adds the level shifting circuit comprising potentiometer RV1 and resistor R3 to the circuit and permits a desired output voltage, usually zero volts, to be set for a given quiescent input current level, i.e. 4 or 10 mA. The resistor R25, when connected between connectors 26a and 26b in place of jumper 36, attenuates the input signal to the isolator and, if capacitor C10 is present, forms part of an integrator for attenuating noise on the input signal line. The resistor R12 functions as a current to voltage converter at the input to operational amplifier 20 or, if resistor R25 is present in the circuit, resistor R12 cooperates with resistor R25 to define a voltage divider for reducing input signal levels. As noted above, capacitor C10 will be installed between connectors 28a and 28b if the input signal is noisy and requires filtering.

As may be seen from the above, the isolator, i.e., operational amplifiers 20 and 22 and their interconnection, will remain unchanged while the device may be adapted for nine different combinations of inputs and outputs. This, in effect, affords the control/protective system designer the ability to employ essentially the same isolator throughout the plant. As noted, the isolator may be configured for the specific input and output requirements and power supply availability simply through changing one or more passive circuit components which are readily available on a universal printed circuit board.

With regard to power supplies, and referring to FIG. 3, if 120 VAC only is available, the full wave rectifier power supply indicated at 40 will be plugged into the circuit board and will mate with the filter/voltage regulator circuit indicated generally at 42. The power supply 40 itself employs a pair of voltage regulators indicated at U1 and U2. The filter circuit 42 output is thirty VDC regulated. If a twelve VDC supply only is available, as is often the case, the power supply indicated at 4 will be plugged into the isolator circuit board so as to cooperate with the filter 42. The power supply 44 includes a DC to DC converter, indicated at T2, which converts the twelve volt input to a regulated thirty volt output. The ability to employ either of power supplies 40 or 44 doubles the number of possible isolators which employ the same basic circuit and common circuit board.

FIG. 3 is an electrical schematic diagram of an actual isolation amplifier of the type depicted in functional block diagram form in FIG. 2. The isolation amplifier actually employs three identical operational amplifiers 50, 52 and 54 and a pair of inverter/shut down circuits, indicated generally at 56 and 58, which respectively are comprised of transistors Q1 and Q2 and transistors Q3 and Q4. Operational amplifier 50, depending on whether resistor R1 is in the circuit, functions as either a voltage follower or a non-inverting amplifier. Operational amplifier 52 cooperates with inverter/shut down circuit 56 to define a double inversion voltage follower. Operational amplifier 54 cooperates with inverter/shut down circuit 58 to also define a double inversion type voltage follower. Transistor Q2 or transistor Q4 will, during a high voltage output fault, be biased into a shut-off condition depending upon the polarity of the fault. This results from the fact that when one of Zener diodes VR-3, VR-4 conducts its associated transistor Q1, Q3 is caused to conduct thus shutting Q2 or Q4 off by establishing a base to emitter short circuit. Zener diodes VR-1 and VR-2 in filter circuit 42 protect power supplies 40 or 44 by limiting the voltage to the range of +18 VDC. When transistor Q2 or Q4 is shut off, voltage or current appearing at the output of the isolator will not be fed back to the input because in one output fault polarity Q2 or Q4 blocks the high voltage and in the other polarity diode rectifiers CR-5 or CR-8 block the high voltage, i.e., Q4 blocks the high voltage when a positive fault voltage appears at the anode of CR-8 and diode rectifier CR-5 blocks a negative fault voltage. Under output short circuit faults, resistors R10 and R17 act as current limiting resistors to limit the current through Q2 and Q4.

Under normal operating conditions, the negative input of the isolator will be grounded and the negative output signal of the isolator will be negative with respect to the positive output terminal. The input-output impedance in the voltage follower configurations is on the order of 1000 meg-ohms. An information bearing signal applied to the positive isolator input terminal will be reflected to the isolator positive output terminal where it will be measured as a voltage appearing across the output impedance comprising resistors R20, R21 and R22. This output voltage will be commensurate with an input voltage or current and the gain of the isolator may be selected to be unity or greater or less than unity by the user.

While a preferred embodiment has been shown and described, various modifications and substitutions may be made thereto without departing from the spirit and scope of the invention. Accordingly, the present invention has been described by way of illustration and not limitation.

What is claimed is:

1. An isolation amplifier for connection between a source of an information bearing signal and a control system responsive to the information provided by the source, the source having a pair of terminals between which the information bearing signal is measured, said isolation amplifier comprising;

first operational amplifier means, said first amplifier means having inverting and non-inverting signal input terminals and a signal output terminal;
   second operational amplifier means, said second amplifier means having inverting and non-inverting signal input terminals and a signal output terminal;
   a first input signal terminal, said first input signal terminal being connectable to a first terminal of the information bearing signal source;
   a second input signal terminal, said second input signal terminal being connectable to a second terminal of the information bearing signal source;
   first variable input circuit means for connecting said first input signal terminal to one of said first operational amplifier means signal input terminals, said first input circuit means including;
      a first pair of spaced connectors in series with said first input signal terminal and said operational amplifier means signal input terminal whereby a passive circuit component may be inserted and electrically connected between said first input signal terminal and said operational amplifier means signal input terminal; and
      second pair of spaced connectors in series with a first connector of said first pair of connectors and the said second input signal terminal whereby a passive circuit component may be inserted and electrically connected between said first connector of said first pair of connectors and said second input signal terminal; second variable circuit means,
   said second variable circuit means including;
      a third pair of spaced connectors in series with the other of said first operational amplifier means signal input terminals and said second input signal terminal whereby a passive circuit component may be inserted and electrically connected between said first operational amplifier means other input terminal and said second input signal terminal to vary the gain of said first operational amplifier means; and
      means for applying an adjustable bias voltage to said other of said first operational amplifier means signal input terminals, said applying means including a pair of spaced contacts whereby said first operational amplifier means other signal input terminal may selectively be isolated from the bias voltage; and
   means connecting the said second input signal terminal to a first input signal terminal of said, second operational amplifier means whereby an output signal related to the information bearing input signal may be measured between said operational amplifier means output terminals.

2. The apparatus of claim 1 wherein said one of said first operational amplifier means signal input terminals is the non-inverting terminal and wherein each of said operational amplifier means is provided with feedback circuit means.

3. The apparatus of claim 2 wherein said bias voltage applying means contacts comprise a fourth pair of spaced connectors.

4. The apparatus of claim 3 wherein said first variable input circuit means further comprises:
   a fifth pair of spaced connectors electrically connected to and parallel with said second pair of spaced connectors whereby a pair of passive circuit components may be connected in parallel between said first connector of said first pair of connectors and the said second input signal terminal to define a filter circuit responsive to noise contained in the input signal received from the information bearing signal source.

5. The apparatus of claim 2 wherein said first variable input circuit means further comprises;
   a fifth pair of spaced connectors electrically connected to and parallel with said second pair of spaced connectors whereby a pair of passive circuit components may be connected in parallel between said first connector of said first pair of connectors and the said second input signal terminal to define a filter circuit responsive to noise contained in the input signal received from the information bearing signal source.

6. The apparatus of claim 1 wherein said bias voltage applying means contacts comprise a fourth pair of spaced connectors.

7. The apparatus of claim 3 wherein said first variable input circuit means further comprises:
   a fifth pair of spaced connectors electrically connected to and parallel with said second pair of spaced connectors whereby a pair of passive circuit components may be connected in parallel between said first connector of said first pair of connectors and the, said second input signal terminal to define a filter circuit responsive to noise contained in the input signal received from the information bearing signal source.

8. The apparatus of claim 1 wherein said first variable input circuit means further comprises;
   a fifth pair of spaced connectors electrically connected to and parallel with said second pair of spaced connectors whereby a pair of passive circuit components may be connected in parallel between said first connector of said first pair of connectors and the said second input signal terminal to define a filter circuit responsive to noise contained in the input signal received from the information bearing signal source.

9. The apparatus of claim 1 further comprising
   voltage regulator means, said voltage regulator means providing a DC voltage at a pair of opposite polarity output terminals, said voltage regulator means having input terminals for receiving a DC voltage;
   power supply means for providing a DC voltage of preselected magnitude to said voltage regulator means; and
   means for selectively electrically connecting said power supply means to said voltage regulator means.

10. The apparatus of claim 9 wherein said power supply means is responsive to an alternating current.

11. The apparatus of claim 9 wherein said power supply means is responsive to a direct current.

12. The apparatus of claim 9 wherein said one of said first operational amplifier means signal input terminals is the non-inverting terminal and wherein each of said operational amplifier means is provided with feedback circuit means.

13. The apparatus of claim 12 wherein said bias voltage applying means contacts comprise a fourth pair of spaced connectors.

14. The apparatus of claim 13 wherein said first variable input circuit means further comprises;
   a fifth pair of spaced connectors electrically connected to and parallel with said second pair of spaced connectors whereby a pair of passive circuit components may be connected in parallel between said first connector of said first pair of connectors and the said second input signal terminal to define a filter circuit responsive to noise contained in the input signal received from the information bearing signal source.

15. The apparatus of claim 14 wherein said power supply means is responsive to an alternating current.

16. The apparatus of claim 14 wherein said power supply means is responsive to a direct current.

* * * * *